United States Patent [19]

Isogai et al.

[11] 4,373,196

[45] Feb. 8, 1983

[54] DECODER CIRCUIT

[75] Inventors: Hideaki Isogai, Higashikurume; Miki Tanaka, Kawasaki, both of Japan

[73] Assignee: Fujitsu Limited, Kawasaki, Japan

[21] Appl. No.: 220,970

[22] Filed: Dec. 29, 1980

[30] Foreign Application Priority Data

Dec. 27, 1979 [JP] Japan .............................. 54-169186

[51] Int. Cl.$^3$ .............................................. G11C 7/00
[52] U.S. Cl. ..................................... 365/189; 307/463
[58] Field of Search ................ 365/189, 191; 307/449, 307/463; 340/804

[56] References Cited

U.S. PATENT DOCUMENTS 4,099,070  7/1978  Reinert ................................. 365/191
4,195,356  3/1980  O'Connell et al. ................. 365/189
4,195,358  3/1980  Yuen ............................. 307/463 X Primary Examiner—Robert L. Richardson
Attorney, Agent, or Firm—Staas & Halsey

[57] ABSTRACT

A decoder circuit comprises a differential amplifier circuit which receives one or a plurality of line selection signals which are to be decoded, switching circuits for switching predetermined lines to in high or low level states according to the output signal supplied from the differential amplifier circuit, and constant current supplying circuits for supplying constant current to the predetermined lines according to the signal supplied from the switching circuits. The switching circuits are connected in parallel with respect to the constant current supplying circuits.

6 Claims, 5 Drawing Figures

DECODER CIRCUIT

BACKGROUND OF THE INVENTION

The present invention relates generally to decoder circuits, and more particularly to a decoder circuit which is suitable for use in memory cell selection in a memory device.

Generally, a memory device comprises a plurality of word lines and bit lines arranged in matrix form, a plurality of memory cells provided at respective intersection points between the word lines and bit lines, a decoder circuit for performing word line selection, and a decoder circuit for performing bit line selection. Conventionally, in a memory system of the above type, a constant current source circuit which provides a bit current to the bit line group and a switching circuit which provides the bit current to only the bit line which is to be selected, are respectively, separately and independently connected in series in a bit line selection decoder circuit. Accordingly, at least two stages of voltage boosting are required for the transistors which constitute the constant current source circuit and switching circuit, resulting in the inability to obtain low-level biasing. Hence, the margin of allowable variation in the power source output level becomes small, and results in a disadvantage in that stable operation of the memory system can not be guaranteed.

SUMMARY OF THE INVENTION

Accordingly, a general object of the present invention is to provide a novel and useful decoder circuit in which the above described problems have been overcome.

Another and more specific object of the present invention is to provide a decoder circuit which comprises a differential amplifier circuit which receives one or a plurality of line selection signals which are to be decoded, switching circuits for switching predetermined line systems in high or low level states according to the output signal supplied from the differential amplifier circuit, and constant current supplying circuits for supplying constant current to predetermined lines of the above line systems according to the signal supplied from the switching circuits, wherein the above switching circuits are connected in parallel with respect to the constant current supplying circuits.

Other objects and further features of the present invention will be apparent from the following detailed description when read in conjunction with the accompanying drawings.

DETAILED DESCRIPTION OF THE PREFERRED EMBODIMENTS

Figure 1:
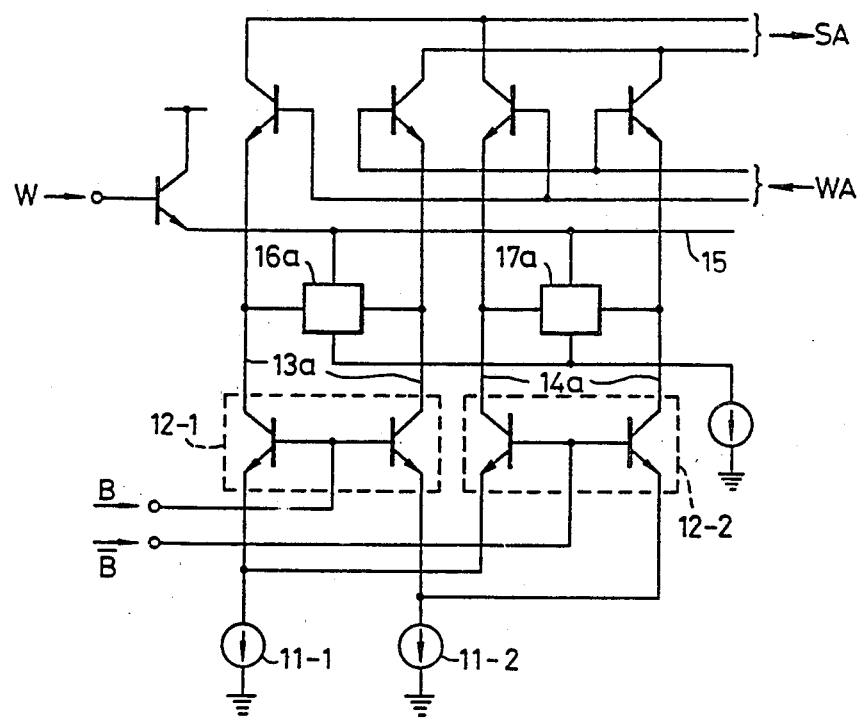
FIG. 1 is a circuit diagram showing an example of a memory device having a conventional decoder circuit.

FIG. 1 shows a circuit diagram of a memory device having a conventional decoder circuit. In FIG. 1, a bit line selection decoder circuit comprises constant current source circuits 11-1 and 11-2, and switching circuits 12-1 and 12-2 which respectively receive bit selection inputs B and $\bar{B}$. The lines subjected to the decoding by the above bit line selection decoding circuit, are bit lines 13a and 14a. A word line 15 runs across these bit lines 13a and 14a, and memory cells 16a and 17a are arranged and provided at each of the intersection points. A sense amplifier and write-in address are respectively designated by SA and WA. While there are, of course, a plurality of word lines 15 and memory cells 16a and 17a, only a part of the device is shown in FIG. 1.

In the decoder circuit in the memory device of FIG. 1, the constant current source circuits (11-1 and 11-2) and the switching circuits (12-1 and 12-2), respectively, are independently connected in series, and therefore, voltage is boosted at the transistors constructing each of the circuits, that is, the voltage is boosted at least by the amount of the base-emitter voltage in the forward direction of the transistors for the two stages. Accordingly, low-level biasing cannot be obtained, and this results in the introduction of the aforementioned problem in which the margin of variance in the power source output level becomes small.

Figure 3:
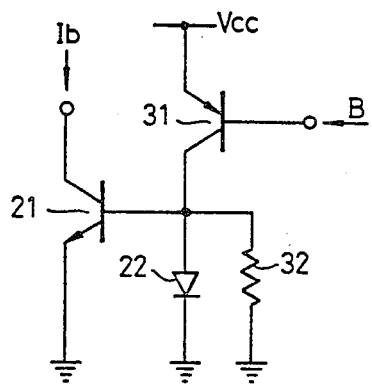
FIG. 3 is a circuit diagram showing the main construction of an embodiment of a decoder circuit according to the present invention.

Hence, in the present invention, instead of the constant current source circuits (11-1 and 11-2) of FIG. 1, the switching circuits shown in FIG. 3 are inserted and connected in parallel with respect to the above circuits, to provide low-level biasing.

Figure 2:
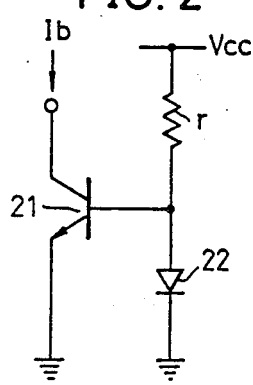
FIG. 2 is a circuit for the device diagram showing the construction of a conventional constant current source circuit of FIG. 1.

The construction of a constant current source circuit of FIG. 1 is shown in FIG. 2. In FIG. 2, an NPN-transistor 21 is a transistor which flows a bit current Ib through the bit line. The above current source circuit of FIG. 2 is of a so-called current mirror type, in which a diode 22 is connected to the base of the transistor 21, for example, the diode formed by the base-emitter junction. Furthermore, the base resistance and the voltage source are respectively designated by r and Vcc.

FIG. 3 shows an embodiment of a decoder circuit of the present invention, in which the switching circuit is inserted and connected in parallel as opposed to the constant current source circuit of FIG. 2. As clearly seen in FIG. 3, a PNP-transistor 31 and a pull-down resistor 32 are inserted and connected in parallel as opposed to the transistor 21 and diode 22. When a bit selection input B of a high level is applied to the base of the transistor 31, the transistor 31 is turned ON. The transistor 21 is also turned ON due to the voltage Vcc applied to the base of the transistor 21, and, accordingly a bit current Ib flows through the respective bit line.

On the other hand, when a selection input B which is of low level is applied to the base of the PNP-transistor 31, the transistor 31 is turned OFF. Accordingly, the base voltage of the transistor 21 becomes of ground potential through the pull-down resistor 32, and the transistor 21 is turned OFF. This means that the bit current Ib is switched according to the selection inputs B. It must be noted that the switching circuits (31 and 32) in the circuit of the present invention differ from the conventional switching circuits (12-1 and 12-2) in that they are positioned outside of the group of bit lines. Therefore, the biasing level of the bit lines is approximately 0.8 volts, which corresponds at the most, to the reverse voltage of the diode 22, and low-level biasing can thus be obtained. Moreover, the margin of variation in the power source output level is increased.

Figure 4:
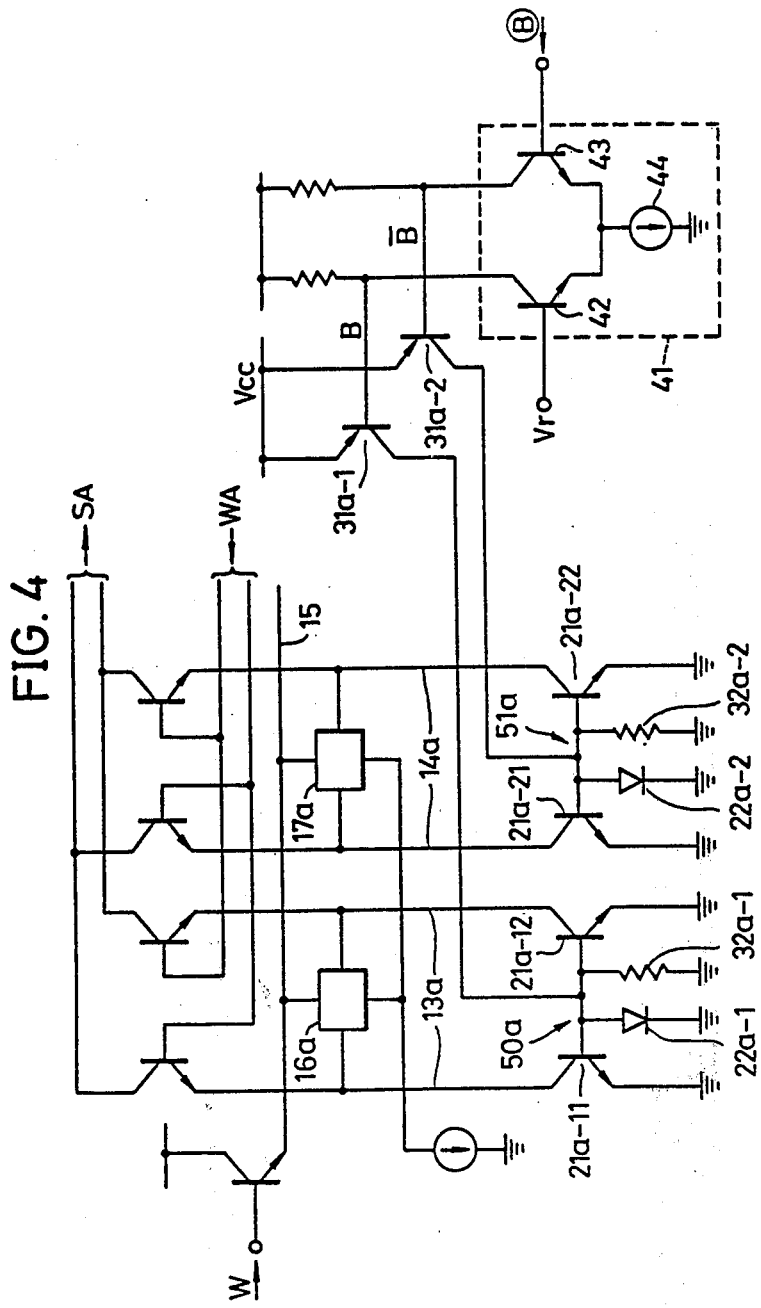
FIG. 4 is a circuit diagram showing an embodiment of a memory device having a decoder circuit of the present invention.

FIG. 4 is a circuit diagram showing one embodiment of a memory device employing the decoder circuit of the present invention. In FIG. 4, those parts which are the same as the corresponding parts in FIG. 1 are designated by like reference numerals, and their description will be omitted. Here, NPN-transistors 21a-11, 21a-12, 21a-21, and 21a-22, diodes 21a-1 and 21a-2, and the like, comprise the above described constant current source circuit parts. In addition to these elements, PNP-transistors 31a-1 and 31a-2, resistors 32a-1 and 32a-2 are provided as shown in FIG. 4. A differential amplifier 41 which applies the bit selection inputs B and $\bar{B}$ to transistors 31a-1 and 31a-2, comprises an NPN-transistor 42 which has a standard voltage Vr as its input, an NPN-transistor 43 which has a bit selection signal Ⓑ as its input, and a constant current source circuit 44.

However, the above differential amplifier 41 is of a known construction, and is a part of the circuit which should produce the bit selection inputs B and $\bar{B}$ of FIG. 1 as output. If the bit selection signal Ⓑ is of high level, for example, the transistor 43 is turned ON and the transistor 42 is turned OFF. Accordingly, the bit selection input B becomes of high level (the bit selection input $\bar{B}$ becomes of low level), turning the transistor 31a-1 OFF, and selects a bit system 51a (bit system 50a is put in a non-selected state). Similarly, when the bit selection signal Ⓑ is of low level, the bit system 50a is then selected, and the bit system 51a is put in a non-selected state.

While the embodiment of FIG. 4 shows a case in which there are two-bit inputs this can be expanded into a four-bit input type, for example. In this modified case, only the construction of the differential amplifier 41 of FIG. 4 is changed.

Figure 5:
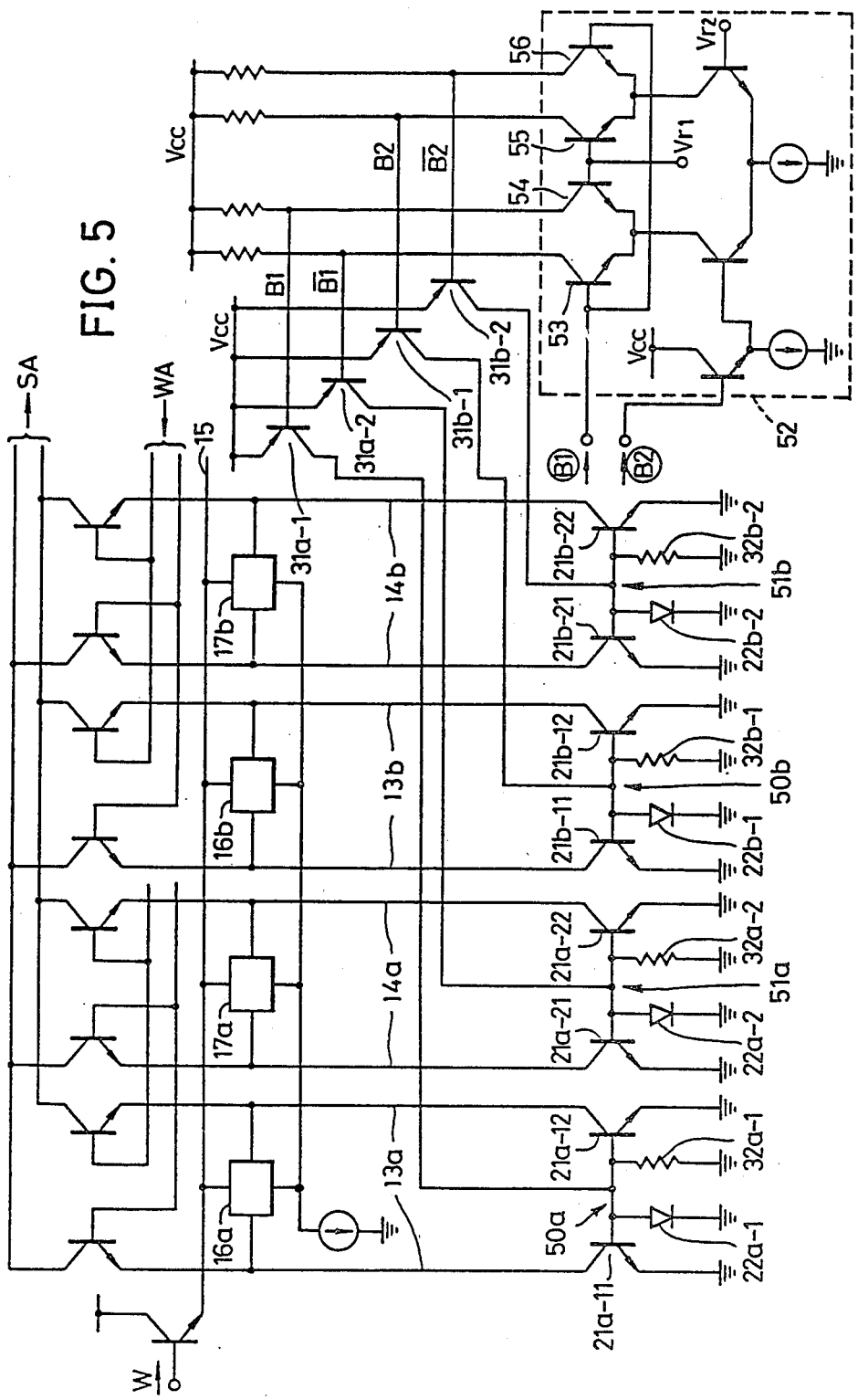
FIG. 5 is a circuit diagram showing a modification of the decoder circuit of FIG. 4 having 4 bit lines.

The above modified case is shown in FIG. 5. In FIG. 5, the parts which are the same as those corresponding parts in FIG. 4 are designated by the like reference numerals, and their description will be omitted.

Those parts having a reference numeral with subscript "b", have the same construction and function as the corresponding parts having the same numeral with subscript "a" of FIG. 4. A known four-bit input differential amplifier 52 is used in this case, and the bit selection signals are designated by Ⓑ1 and Ⓑ2. Similarly, as in the case of the differential amplifier 41 of FIG. 4, when the bit selection signal Ⓑ1 is of high level, for example, an NPN-transistor 53 is turned ON and an NPN-transistor 54 is turned OFF. Accordingly, a bit selection input B1 becomes high level (the bit selection input $\bar{B1}$ becomes low level), turning the transistor 31a-1 OFF, and selects the bit system 51a (the bit system 50a is put in a non-selected state). Moreover, when the bit selection signal Ⓑ1 is of low level, the bit system 50a is then selected, and the bit system 51a is put in a non-selected state. By similar procedures, bit systems 50b and 51b can be selected, according to the level of the bit selection signal Ⓑ2. By the logic combination of these bit selection signals Ⓑ1 and Ⓑ2, one of the four-bit inputs B1, $\bar{B1}$, B2, or $\bar{B2}$ is always of low level, and thus selects one of the corresponding bit system from the bit systems 50a, 51a, 50b, or 51b. These logic combinations are shown in the following table, in which "H" and "L" respectively indicate high and low levels.

TABLE

| Ⓑ1 | Ⓑ2 | $\bar{B1}$ | B1 | B2 | $\bar{B2}$ |
|---|---|---|---|---|---|
| H | H | L | H | H | H |
| H | L | H | H | H | L |
| L | H | H | L | H | H |
| L | L | H | H | L | H |

Accordingly, a system having a high stability factor can be realized, since, according to the present invention, a decoder circuit which can be biased at low level is obtained, increasing the margin of variance in the output level of the power source within the system.

Further, this invention is not limited to the above-described embodiments, but variations and modifications may be made without departing from the scope of the invention.

What is claimed is:

1. A decoder circuit comprising:
a plurality of outputs select lines, each having active and non-active states;
a differential amplifier circuit for receiving at least one line selection signal to be decoded and for generating an output signal in response to said line selection signal;
switching circuits operatively connected to said differential amplifier circuit, for providing a switching signal to activate selected lines of said output select lines according to the output signal supplied from said differential amplifier circuit; and
constant current supplying circuits correspondingly connected to said switching circuits and to said output select lines, for supplying constant current to the selected output select lines according to the switching signal supplied from said switching circuits, said switching circuits being connected in parallel with respect to said constant current supplying circuits.

2. A decoder circuit as described in claim 1, wherein each of said switching circuits comprises:
A resistor having a first terminal connected to ground and a second terminal;
a PNP-transistor comprising an emitter connected to a predetermined electrical potential point, a collector connected to said second terminal of said resistor, and a base operatively connected to receive said corresponding output signal from said differential amplifier circuit, and wherein each of said constant current supplying circuits comprises:
a diode having a cathode connected to ground and an anode;
an NPN-transistor comprising a collector connected to said corresponding output select line, a base connected to said PNP-transistor of said corresponding switching circuit and to said anode of said diode, and an emitter connected to ground.

3. A decoder circuit as claimed in claim 1, wherein said line selection signals are bit line selection signals, said output select lines are bit lines, and wherein said decoder circuit selects bit lines in response to said bit line selection signals.

4. A decoder circuit as claimed in claim 2, wherein said line selection signals are bit line selection signals, said output select lines are bit lines, and wherein said decoder selects bit lines in response to said bit line selection signals.

5. A decoder circuit as claimed in claim 1, wherein said line selection signals are word line selection signals, said output select lines are word lines, and wherein said decoder circuit selects word lines in response to said word line selection signals.

6. A decoder circuit as claimed in claim 2, wherein said line selection signals are word line selection signals, said output select lines are word lines, and wherein said decoder circuit selects word lines in response to said word line selection signals.

* * * * *

UNITED STATES PATENT AND TRADEMARK OFFICE
CERTIFICATE OF CORRECTION

PATENT NO. : 4,373,196

DATED : February 8, 1983

INVENTOR(S) : Isogai et al.

It is certified that error appears in the above-identified patent and that said Letters Patent is hereby corrected as shown below:

Front page, [75] Inventors, "Higashikurume" should be --Tokyo--.

Front page, [57] Abstract, line 5, delete "in".

Col. 1, line 58, delete "for the device";
Col. 1, line 60, after "circuit" insert --for the device--.

Signed and Sealed this

Thirty-first Day of May 1983

[SEAL]

Attest:

DONALD J. QUIGG

Attesting Officer

Acting Commissioner of Patents and Trademarks